(12) United States Patent
Zuo

(10) Patent No.: US 6,579,747 B1
(45) Date of Patent: Jun. 17, 2003

(54) METHOD OF MAKING ELECTRONICS PACKAGE WITH SPECIFIC AREAS HAVING LOW COEFFICIENT OF THERMAL EXPANSION

(76) Inventor: Jon Zuo, 1030 Lehn Dr., Lancaster, PA (US) 17601

( * ) Notice: Subject to any disclaimer, the term of this patent is extended or adjusted under 35 U.S.C. 154(b) by 0 days.

(21) Appl. No.: 10/219,731

(22) Filed: Aug. 15, 2002

Related U.S. Application Data

(62) Division of application No. 10/081,470, filed on Feb. 21, 2002.

(51) Int. Cl.⁷ .............................................. H01L 21/50
(52) U.S. Cl. ........................ 438/122; 438/22; 438/24; 438/123; 257/675; 257/706; 257/707; 257/720
(58) Field of Search ............................. 438/22, 24, 117, 438/122–127; 257/81, 99, 177–181, 584, 625, 675, 688, 689, 705–707, 712–722, 796

(56) References Cited

U.S. PATENT DOCUMENTS

| 4,323,914 | A | | 4/1982 | Berndlmaier et al. |
| 5,223,747 | A | | 6/1993 | Tschulena |
| 5,843,807 | A | | 12/1998 | Burns |
| 5,884,693 | A | | 3/1999 | Austin et al. |
| 5,890,371 | A | | 4/1999 | Rajasubramanian et al. |
| 6,075,287 | A | | 6/2000 | Ingraham et al. |
| 6,076,595 | A | | 6/2000 | Austin et al. |
| 6,150,195 | A | | 11/2000 | Chiu et al. |
| 6,191,478 | B1 | | 2/2001 | Chen |
| 6,238,954 | B1 | | 5/2001 | Ma et al. |
| 6,309,908 | B1 | * | 10/2001 | Sarihan et al. ............... 438/106 |
| 6,326,242 | B1 | * | 12/2001 | Brooks et al. ............... 438/111 |
| 2001/0052652 | A1 | * | 12/2001 | Smith et al. ................. 257/783 |

* cited by examiner

Primary Examiner—David Nelms
Assistant Examiner—Long Tran
(74) Attorney, Agent, or Firm—Duane Morris LLP

(57) ABSTRACT

Method of making semiconductor package including at least one semiconductor chip disposed within a housing, the housing including a lid which overlies the at least one semiconductor chip and a heat-dissipating device coupled to the housing, the heat-dissipating device including at least one area formed of a material with a low coefficient of thermal expansion.

2 Claims, 3 Drawing Sheets

METHOD OF MAKING ELECTRONICS PACKAGE WITH SPECIFIC AREAS HAVING LOW COEFFICIENT OF THERMAL EXPANSION

This application is a divisional application of U.S. application Ser. No. 10/081,470, filed on Feb. 21, 2002.

FIELD OF THE INVENTION

The present invention relates to a method and apparatus for removing heat from electronic equipment, and in particular, a heat pipe system for removing heat from semiconductor chips and packages.

DESCRIPTION OF THE RELATED ART

FIG. 1 shows a cross sectional view of a conventional semiconductor package 10. The package 10 includes a substrate 15, a lid 20, and a semiconductor chip 25. The semiconductor chip 25 is bonded to the substrate 15 utilizing solder and/or epoxy. Such a package 10 is often referred to as a 'flip chip' package, as the package is manufactured by 'flipping' the semiconductor chip 25 so that its terminals face terminals formed on a side of the substrate 15. Typically, ball-shaped solder terminals 30 are formed on either the terminals of the semiconductor chip 25 or the terminals of the substrate 15, or both. Thus, when the package 10 is heated, the solder balls 30 melt and create a reliable connection between the chip 25 and the substrate 15. Epoxy 35 may also be used in addition to the solder balls 30 to create a more reliable connection and provide stress relief.

When the package 10 is operated in its usual fashion, heat generated by the junctions of the semiconductor chip 25 is conducted through the chip and the lid 20, before exiting the package 10. Typically, heat is generated at the terminals of the semiconductor chip 25 and the terminals of the substrate 15, and therefore must pass through the solder 30 and epoxy 35, through the chip 25 body, and through the lid 20 before exiting the package 10.

In most cases the lid 20 is coupled to a heat sink or similar heat dissipation apparatus (not shown), to assist in moving heat away from the chip 25. The lid 20 is usually made of a low coefficient of thermal expansion (CTE) material such as Copper Tungsten (CuW) or Aluminum Silicon Carbonate (AlSiC). Such materials minimize the thermal stress caused by the mismatching of the CTE's of the chip and the lid materials.

It has been shown that either AlSiC or CuW has a thermal conductivity large enough to effectively spread local, high heat fluxes. Previous attempts have been made to embed more conductive materials such as chemical vapor deposited (CVD) diamond and thermal pyrolytic graphite materials into AlSiC materials to achieve thermal conductivity values up to 1,000 Watts/m-K (meter-Kelvin). However, these approaches are generally quite expensive and cannot provide sufficient heat spreading performance at some very high heat flux conditions.

Heat pipes, and in particular flat heat pipes, have been shown to be able to spread very high heat fluxes (e.g., above 100 Watts/centimeter$^2$ (W/cm$^2$)) with minimal thermal resistances. In a typical application, a flat heat pipe has an equivalent thermal conductivity of at least 50,000 W/m-K, which is an improvement of approximately 50 times over the AlSiC-CVD diamond material. One example of a flat heat pipe currently being produced and used for this purpose is the Therma-Base™ heat pipe produced by Thermacore, International, Inc. of Lancaster, Pa. (the assignee of the present application).

A basic heat pipe comprises a closed or sealed envelope or a chamber containing an isotropic liquid-transporting wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber defined as a condenser section. The vapor is condensed in the condenser section and returned through the liquid-transporting wick to the evaporator section by capillary pumping action.

Because it operates on the principle of phase changes rather than on the principles of conduction, a heat pipe is theoretically capable of transferring heat at a much higher rate than conventional heat conduction systems. Consequently, heat pipes have been utilized to cool various types of high heat-producing apparatus, such as electronic equipment (See, e.g., U.S. Pat. Nos. 5,884,693, 5,890,371, and 6,076,595).

However, conventional heat pipes cannot be bonded directly to most semiconductor chips due to the mismatching that occurs between the material from which the heat pipe is formed (e.g., Copper (Cu)), and the material from which the semiconductor chip is formed (e.g., Silicon (Si)).

Some have suggested that the solution may lie in conversion of the package lid itself into a heat pipe, thus avoiding the bonding problem. However, there are several shortcomings with this approach. First, AlSiC (i.e., the material from which the lid is formed) is chemically incompatible with water (one of the best working fluids for heat pipe cooling of electronics), and other possible fluids (e.g., refrigerants) cannot provide the necessary thermal performance without advanced and sometimes expensive wick designs. Second, Silicon (Si) and AlSiC are difficult to machine, thus increasing the manufacturing costs of such heat pipes. Finally, Tungsten (W) and Copper Tungsten (CuW) are heavy and expensive, and their compatibility with water is also questionable at best.

Therefore, there is currently a need for a system for effectively transferring maximum heat from a semiconductor chip package and having a CTE that is compatible with the chip package.

I.

SUMMARY OF THE INVENTION

The present invention is a semiconductor package including at least one semiconductor chip within a housing, the housing including a lid which overlies at least one semiconductor chip and a heat-dissipating device coupled to the housing, the heat-dissipating device including at least one area formed of a material with a low coefficient of thermal expansion.

The above and other advantages and features of the present invention will be better understood from the following detailed description of the exemplary embodiments of the invention which is provided in connection with the accompanying drawings.

DETAILED DESCRIPTION

The present invention comprises a heat pipe with areas where a material with a low coefficient of thermal expansion (CTE) is coupled thereto at specific positions. When the heat pipe is coupled to a semiconductor package, the low CTE areas allows the heat pipe to effectively bond to the package, and thus create an excellent thermal connection between the heat pipe and the semiconductor package. This thermal connection allows significantly more heat to be dissipated away from the semiconductor package.

Figure 1:
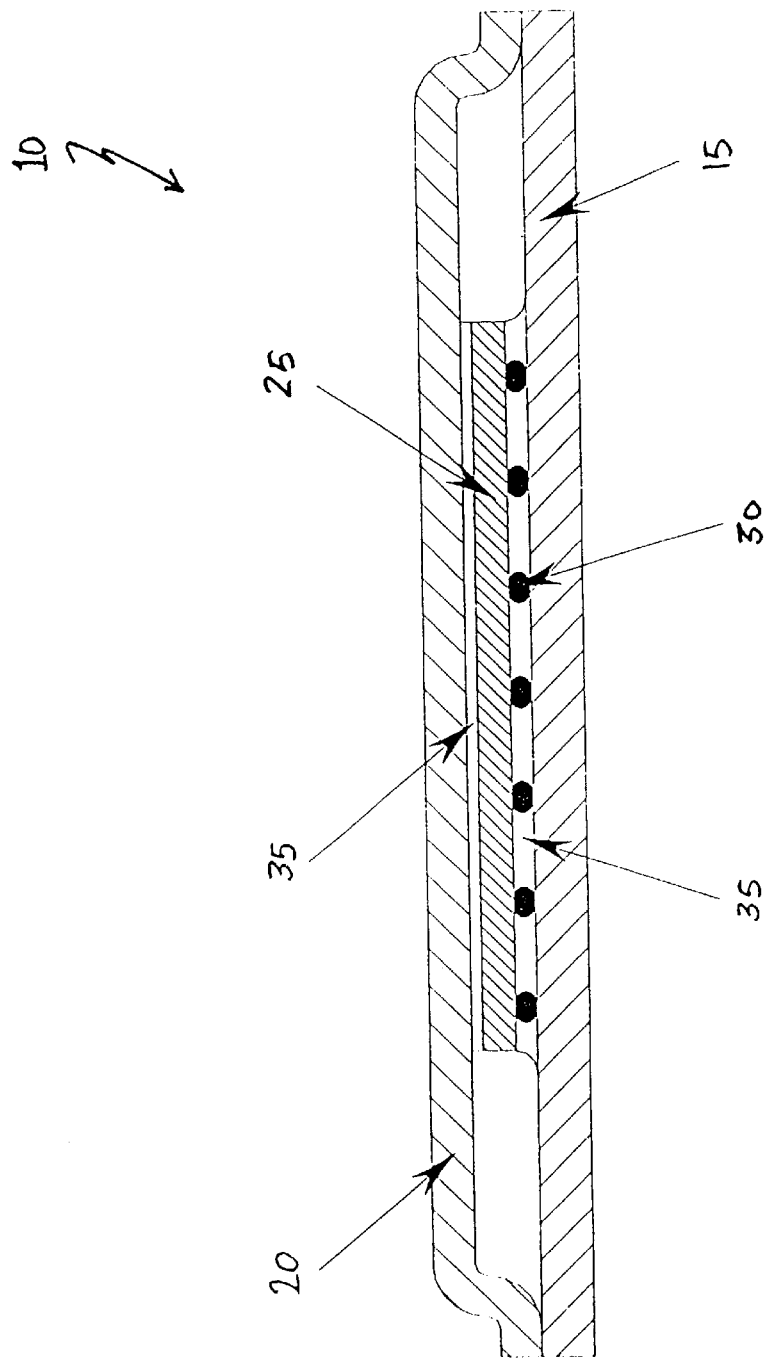
FIG. 1 is a cross sectional view showing a conventional semiconductor package.
Figure 2A:
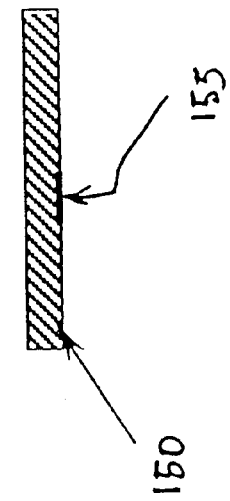
FIG. 2(a) is a cross sectional view showing a heat pipe according to a first exemplary embodiment of the present invention.
Figure 2B:
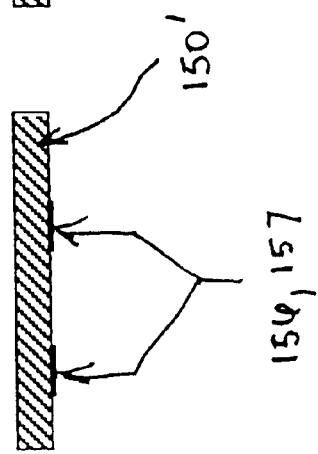
FIG. 2(b) is a cross sectional view showing a heat pipe according to a second exemplary embodiment of the present invention.
Figure 2C:
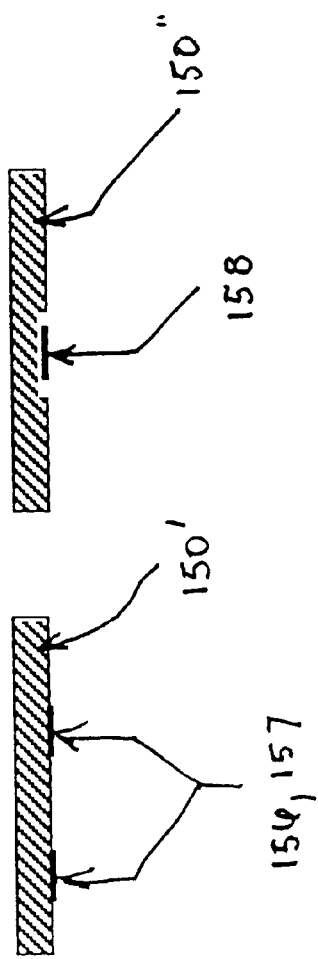
FIG. 2(c) is a cross sectional view showing a heat pipe according to a third exemplary embodiment of the present invention.

Referring to FIGS. 2(a)–2(c), there is shown three different exemplary embodiments of heat pipes according to the present invention.

FIG. 2(a) is a cross sectional view showing a heat pipe 150 according to a first exemplary embodiment of the present invention. The heat pipe 150 includes a centrally disposed plate 155 formed of a material with a low coefficient of thermal expansion (CTE). Preferably, the heat pipe 150 and the low CTE plate 155 are formed separately, and then bonded together by known processes (e.g., brazing). As is well known in the art, the heat pipe 150 is preferably formed of a metal (e.g., Copper) envelope with a wick and a working fluid disposed therein. In FIG. 2(a), the metal envelope of the heat pipe 150 is substantially rectangular, but it will be recognized by those of ordinary skill in the art that the heat pipe may be formed in a variety of shapes (e.g., tubular shapes, etc.).

FIG. 2(b) is a cross sectional view showing a heat pipe 150' according to a second exemplary embodiment of the present invention. The heat pipe 150' includes two plates 156, 157 formed of a material with a low coefficient of thermal expansion (CTE). Preferably, the heat pipe 150' and the low CTE plates 156, 157 are formed separately, and then bonded together by known processes (e.g., brazing). As is well known in the art, the heat pipe 150' is preferably formed of a metal (e.g., Copper) envelope with a wick and a working fluid disposed therein. In FIG. 2(b), the metal envelope of the heat pipe 150' is substantially rectangular, but it will be recognized by those of ordinary skill in the art that the heat pipe may be formed in a variety of shapes (e.g., tubular shapes, etc.).

FIG. 2(c) is a cross sectional view showing a heat pipe 150" according to a third exemplary embodiment of the present invention. The heat pipe 150" includes a centrally disposed plate 158 formed of a material with a low coefficient of thermal expansion (CTE). The plate 158 is located in a centrally disposed recess 151 formed in the heat pipe 150. Preferably, the heat pipe 150" and the low CTE plate 158 are formed separately, and then bonded together by known processes (e.g., brazing). As is well known in the art, the heat pipe 150" is preferably formed of a metal (e.g., Copper) envelope with a wick and a working fluid disposed therein. In FIG. 2(c) the metal envelope of the heat pipe 150 is substantially rectangular with a centrally disposed rectangular recess, but it will be recognized by those of ordinary skill in the art that the heat pipe and the recess may be formed in a variety of shapes (e.g., tubular shapes, etc.).

Of course it will be understood by those skilled in the art that the first through third embodiments described above are only exemplary, and that heat pipes of many different sizes and shapes, with low CTE plates placed in a variety of different areas, all come within the scope of the present invention. Moreover, although the above discussion centers on using the exemplary heat pipes to cool semiconductor packages, those of ordinary skill in the art will recognize, that the heat pipes may be coupled to a variety of different heat producing devices or elements to provide cooling. However, it is important that the low CTE plates be placed at locations where the heat pipe will be bonded to the semiconductor package (or other heat-producing device), and where a significant amount of heat is generated.

Preferably, the heat pipe and the low CTE plates are hard bonded together (by, for example, brazing). The low CTE plates are preferably located in areas where the high heat flux chips will be attached. However, the following conditions should be maintained in order for the package assembly to withstand thermal stresses:

II.

1) $E_{Cu}\Delta\alpha\Delta T\ (1-\mu) < Y_{Cu}$, where $E_{Cu}$=Copper modulus, $\Delta\alpha$=CTE difference between Copper and low CTE material chosen for plates, $\Delta T$=temperature swing, $\mu$=Poisson ratio, and $Y_{Cu}$=Copper yield strength;
2) $E_{Cu}\Delta\alpha\Delta T\ (1-\mu)(\delta_{Cu}/L_{Bond}) < Y_{Bond}$, where $E_{Cu}$=Copper modulus, $\Delta\alpha$=CTE difference between Copper and low CTE material chosen for plates, $\Delta T$=temperature swing, $\mu$=Poisson ratio, $\delta_{Cu}$=Copper thickness, $L_{Bond}$=Copper-to-low CTE material bond perimeter, and $Y_{Bond}$=Copper-to-low CTE material bond yield strength; and,
3) $E_{Cu}\Delta\alpha\Delta T\ (1-\mu)(\delta_{Cu}/\delta_{LowCTE}) < Y_{LowCTE}$, where $E_{Cu}$=Copper modulus, $\Delta\alpha$=CTE difference between Copper and low CTE material chosen for plates, $\Delta T$=temperature swing, $\mu$=Poisson ratio, $\delta_{Cu}$=Copper thickness, $\delta_{LowCTE}$=low CTE material thickness, and $Y_{LowCTE}$=low CTE material yield strength.

Moreover, there are at least two additional features of the present design which should be maintained:

1) The bonds between the heat pipe and the low CTE plates must be made very strong (i.e., $Y_{bond}$ must be large) in order to withstand thermal stresses caused by repeated thermal cycling. Brazing is preferred because of the strength to withstand the mismatching between the Copper of the heat pipe and the low CTE material (e.g., AlSiC) of the plates.
2) The low CTE plates must be stronger than the Copper envelope of the heat pipe so the Copper rather than the low CTE plates will deform under thermal stresses. This can be achieved by either increasing the low CTE plate thickness ($\delta_{LowCTE}$) or decreasing the Copper envelope thickness ($\delta_{Cu}$).

Figure 3:
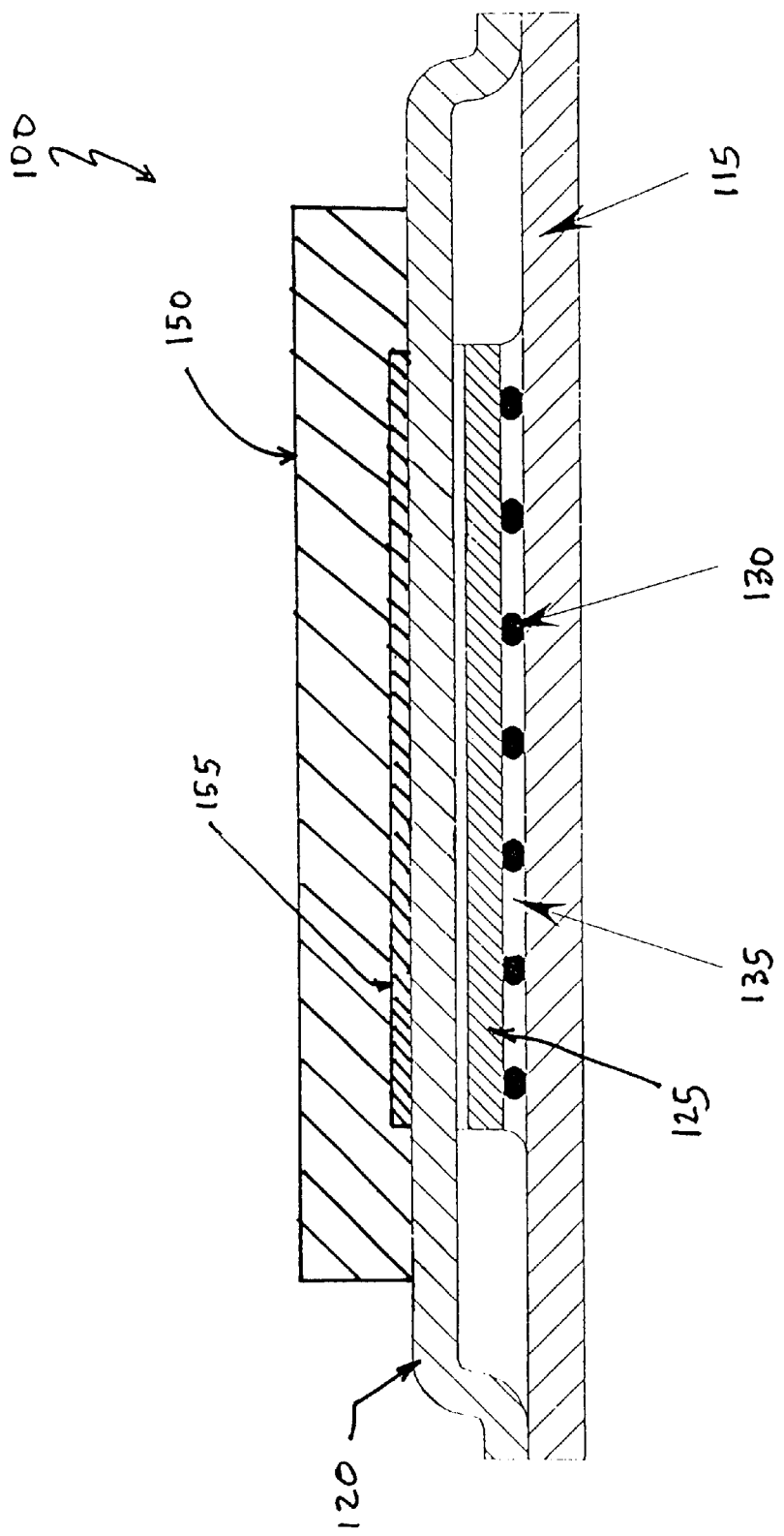
FIG. 3 is cross sectional view showing a semiconductor package utilizing the heat pipe according to the first exemplary embodiment of the present invention.

FIG. 3 shows a cross sectional view of a semiconductor package 100 according to an exemplary embodiment of the present invention. The package 100 includes a substrate 115, a lid 120, and a semiconductor chip 125. The package also includes a heat pipe 150 bonded to the lid 120. The semiconductor chip 125 is bonded to the substrate 115 utilizing solder and/or epoxy. Such a package 110 is often referred to as a 'flip chip' package, as the package is manufactured by 'flipping' the semiconductor chip 125 so that its terminals face terminals formed on a side of the substrate 115. Typically, ball-shaped solder terminals 130 are formed on either the terminals of the semiconductor chip 125 or the terminals of the substrate 115, or both. Thus, when the package 100 is heated, the solder balls 130 melt and create a reliable connection between the chip 125 and the substrate 115. Epoxy 135 may also be used in addition to the solder balls 130 to create a more reliable connection and provide stress relief.

The heat pipe 150 bonded to the lid 120 of the package includes an area 155 formed of a material with a low coefficient of thermal expansion (CTE). The low CTE area 155 is centrally disposed in the embodiment shown in FIG. 3, but as explained above with reference to FIGS. 2(*a*)–2(*c*), the low CTE area may be disposed in any suitable area of the heat pipe. The low CTE area should preferably be located in an area where a significant amount of heat is present (e.g., directly above the chip or chips of the package). It will be noted that the low CTE area 155 in FIG. 3 is disposed substantially overtop of the semiconductor chip 125.

One of the advantages of the package according to the exemplary embodiment of the present invention is decreased cost. Heat pipes are well known and readily available. Another advantage of the present package is the high thermal performance provided by heat pipes.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A method for cooling a heat-producing element, comprising steps of:

brazing a heat-dissipating element to a portion of a housing in a vicinity of the heat-producing element, said heat-dissipating element comprising at least one plate formed of a material with a coefficient of thermal expansion that is intermediate of the coefficients of thermal expansion of said at least one semiconductor chip and a remainder of said housing.

2. A method for manufacturing a heat pipe assembly, comprising steps of:

forming a heat pipe assembly housing with at least one plate formed of a material with a coefficient of thermal expansion that is intermediate of the coefficients of thermal expansion of said at least one semiconductor chip and a remainder of said housing.

\* \* \* \* \*